United States Patent [19]

Roeschert et al.

[11] Patent Number: 5,227,276
[45] Date of Patent: Jul. 13, 1993

[54] NEGATIVE-WORKING RADIATION-SENSITIVE MIXTURE, AND RADIATION-SENSITIVE RECORDING MATERIAL PRODUCED WITH THIS MIXTURE

[75] Inventors: Horst Roeschert, ober-Hilbersheim; Georg Pawlowski, Wiesbaden; Juergen Fuchs, Wicker, all of Fed. Rep. of Germany

[73] Assignee: Hoechst Aktiengesellschaft, Frankfurt am Main, Fed. Rep. of Germany

[21] Appl. No.: 871,033

[22] Filed: Apr. 20, 1992

[30] Foreign Application Priority Data

Apr. 20, 1991 [DE] Fed. Rep. of Germany ....... 4112972

[51] Int. Cl.$^5$ .................... G03F 7/004; G03F 7/039; G03F 7/32
[52] U.S. Cl. .................. 430/252; 430/280; 430/270; 430/273; 430/325; 430/260; 430/330; 430/258; 522/50
[58] Field of Search .............. 430/280, 270, 273, 325, 430/252, 258, 260, 330; 522/50

[56] References Cited

U.S. PATENT DOCUMENTS

| | | | |
|---|---|---|---|
| 3,692,560 | 9/1972 | Rosenkranz et al. | 117/93.31 |
| 4,840,867 | 6/1989 | Elsaesser et al. | 430/156 |
| 5,057,397 | 10/1991 | Miyabe et al. | 430/270 |

FOREIGN PATENT DOCUMENTS

| | | | |
|---|---|---|---|
| 0164248 | 12/1985 | European Pat. Off. | |
| 0232972 | 1/1987 | European Pat. Off. | |
| 0388813A2 | 9/1990 | European Pat. Off. | 430/270 |
| 3930087 | 3/1991 | Fed. Rep. of Germany | |

OTHER PUBLICATIONS

C. G. Willson, "Organic Resist Materials—Theory and Chemistry", Introduction to Microlithography ACS Symp. Ser. 219, 1983, pp. 88-159.

J. V. Crivello, "Possibilities for Photoimaging Using Onium Salts", Polymer Engineering and Science, vol. 23, No. 17, Dec. 1983, pp. 953-956.

F. M. Houlihan et al., "An Evaluation of Nitrobenzyl Ester Chemistry for Chemical Amplification Resists", SPIE vol. 920, 1988, pp. 67-73.

*Primary Examiner*—Cynthia Hamilton
*Attorney, Agent, or Firm*—Foley & Lardner

[57] ABSTRACT

A negative-working radiation-sensitive mixture containing
 a) a compound which generates a strong acid under the action of actinic radiation,
 b) a compound having at least two groups crosslinkable by means of acid and
 c) a polymeric binder which is insoluble in water and soluble or at least swellable in aqueous alkaline solutions, wherein the compound (a) contains a 2,4,6-tris-(2-hydroxyethoxy)-[1,3,5]triazine which is esterified with two or three arylsulfonic acids or heteroarylsulfonic acids, is distinguished by high resolution and high sensitivity over a wide spectral range. It also shows high thermal stability and does not form any corrosive photolysis products on exposure. A radiation-sensitive recording material which has been produced with this mixture is suitable for the production of photoresists, electronic components, printed plates or for chemical milling.

20 Claims, No Drawings

NEGATIVE-WORKING RADIATION-SENSITIVE MIXTURE, AND RADIATION-SENSITIVE RECORDING MATERIAL PRODUCED WITH THIS MIXTURE

BACKGROUND OF THE INVENTION

1. Field of the Invention

The invention relates to a negative-working radiation-sensitive mixture containing a) a compound which generates a strong acid under the action of actinic radiation, b) a compound having at least two groups crosslinkable by means of acid and c) a polymeric binder which is insoluble in water and soluble or at least swellable in aqueous alkaline solutions.

The invention also relates to a radiation-sensitive recording material produced with this mixture which is suitable for producing photoresists, electronic components, printing plates or for chemical milling.

2. Description of Related Art

The continuing reduction in the size of the structures, for example in chip manufacture down into the range of less than 1 μm, requires modified lithographic techniques. To form images of such fine structures, radiation of a short wavelength is used, such as high-energy UV light, electron beams and X-rays. The radiation-sensitive mixture must be adapted to the shortwave radiation. A compilation of the requirements to be met by the radiation-sensitive mixture is given in the article by C. G. Willson "Organic Resist Materials—Theory and Chemistry" [Introduction to Microlithography, Theory, Materials, and Processing, editors L. F. Thompson, C. G. Willson, M. J. Bowden, ACS Symp Ser , 219, 87 (1983), American Chemical Society, Washington].

There is therefore an increased demand for radiation-sensitive mixtures which can be used in the more recent technologies, such as mid-UV or deep-UV lithography, exposure, for example, with excimer lasers at wavelengths of 305 nm (XeF), 248 nm (KrF), 193 nm (ArF), electron beam lithography or X-ray lithography, and which, furthermore, are preferably sensitive in a wide spectral region and correspondingly can also be used in conventional UV lithography.

Negative-working radiation-sensitive mixtures which contain bisazides as crosslinking agents and binders derived from isoprene are known. They are used as radiation-sensitive layers in the production of printing plates, printed circuits and integrated circuits. Their use in microlithography is, however, restricted by various technical disadvantages. Particularly, it is difficult to produce qualitatively high-grade layers without pinholes. The heat holdout of such mixtures is inadequate, i.e., the resist images are distorted by thermal flow during processing. Finally, their resolution capacity is restricted to structures of >2μm. During the necessary development with organic solvents, they show undesirably high swelling even in the hardened areas, which in turn causes structure distortions or inhomogeneous developing processes and hence inadequate reproduction of the image predetermined by the exposure mask.

To be able to produce resist images having a resolution of better than 2μm, other negative-working radiation-sensitive mixtures have been developed which are sensitive to radiation of shorter wavelength, for example, to high-energy UV radiation, electron beams or X-rays. Such a mixture contains, for example, a copolymer of 2,3-epoxypropyl methacrylate and 2,3-dichloropropyl methacrylate (DCOPA) or a combination of the corresponding homopolymers. The glass transition temperature of this mixture is, however, too low for many applications and, in particular, the low resistance of the mixture to plasma etching is to be criticized. Furthermore, even this resist material must be processed using developers based on organic solvents which are rather prone to pollute the environment. However, other hitherto known negative-working, aliphatically based photoresists also show a low resistance to plasma etching.

In European Patent Application 0,164,248, an acid-curable mixture is described which can be developed in aqueous alkaline media, has an improved plasma-etching resistance due to the use of aromatics and is sensitive to near UV light (350 to 450 nm). The acid generators mentioned here are especially sulfonic acid ester derivatives of diazonaphthoquinone, which form weakly acidic carboxylic acids on exposure and are therefore effective only in a comparatively high concentration. Due to the weak absorption and the inadequate bleaching properties of the photolytic acid generator, however, such mixtures have a low sensitivity to DUV radiation, electron beams and X-rays.

In U.S. Pat. No. 3,692,560, an acid-curable mixture is described which contains an acid-crosslinkable melamine derivative, a novolak and chlorinated benzophenones as photolytic acid generators. These mixtures again do not have an adequate sensitivity in the deep UV region. Furthermore, hydrohalic acids are undesired as crosslinking catalysts, since these can, during the subsequent doping processes, undergo reactions with the dopants. Moreover, hydrohalic acids remaining in the cured resist have a strong corrosive action and can cause destruction of the material to be imaged and of the production equipment.

The same applies to the acid-generating derivatives of DDT, mentioned in European Patent Application No. 0,232,972, which are highly toxic and, if only for this reason, cannot be suitable for practice. Nevertheless, such compounds show a considerable sensitivity in the deep UV region (200 to 300 nm).

As the compounds which generate a strong acid on irradiation, especially onium salts, such as diazonium, phosphonium, sulfonium and iodonium salts of nonnucleophilic acids such as $HSbF_6$, $HAsF_6$ or $HPF_6$ as described in J. V. Crivello, Polym. Eng. Sci., 23 (1983) 953, have hitherto been used. In addition, halogen compounds, especially trichloromethyltriazine derivatives or trichloromethyloxadiazole derivatives, o-quinonediazidesulfonyl chlorides, o-quinonediazide-4-sulfonic acid esters, organometal/organohalogen combinations, bis(sulfonyl)diazomethanes, sulfonylcarbonyldiazomethanes (See DE-A 3,930,087) or nitrobenzyl tosylates [See F. M. Houlihan et al., SPIE Proc., Adv. in Resist Techn. and Proc. 920 (1988) 67] have been recommended.

These compounds are used in negative- or positive-working radiation-sensitive mixtures. The use of such photolytic acid generators involves, however, also certain disadvantages which drastically restrict the possible uses thereof in various fields of application. Thus, for example, many of the onium salts are toxic. Their solubility is inadequate in many solvents, which is why only a few solvents are suitable for preparing a coating solution. Furthermore, when the onium salts are used, undesired foreign atoms are sometimes introduced which can cause interference with the process, especially in microlithography. Moreover, the onium salts form Broenstedt acids, which have a very severe corrosive action, in the photolysis. These acids attack sensitive substrates, so that the use of such mixtures leads to unsatisfactory results. The halogen compounds and also the quinonediazidesulfonic acid chlorides also form hydrohalic acids which have a severely corrosive action. In addition, since such compounds also have only a limited storage life on certain substrates, it was attempted to improve this by inserting an interlayer between the substrate and the radiation-sensitive layer containing photolytic acid generators. However, this measure led to an undesired increase in defects and to diminished reproducibility (DE-A 3,621,376 U.S. Patent No. 4,840,867).

In more recent papers by F. M. Houlihan et al., SPIE 920, 67 (1988), it was shown by reference to positive-working systems that, in addition to the above-mentioned acid generators, nitrobenzyl tosylates, which on exposure also generate sulfonic acids having a low migration tendency, can be used in certain acid-unstable resist formulations. It can be deduced from these results that such compounds can also be used for photo-curable systems. The sensitivities thus achieved and the thermal stability of the photoresists proved, however, to be inadequate.

In spite of the intensive research activity so far carried out in this field, no radiation-sensitive mixture is at present known, by means of which a negative-working radiation-sensitive recording material can be produced which has a high sensitivity in the DUV region, that is 200 to 300 nm, and high resolution, and which, on irradiation, does not release an acid which has a corrosive action, and can be developed in aqueous alkaline media.

There is therefore a demand for radiation-sensitive mixtures which contain photolytically acting acid generators and which do not have the disadvantages described above and thus possess an adequate reactivity and acid strength for causing compounds of type (b) to crosslink even in short exposure times.

SUMMARY OF THE INVENTION

It was therefore an object of the invention to develop a radiation-sensitive mixture which, in addition to acid-generating compounds, also contains acid-crosslinkable compounds, wherein the acid-generating compounds should be as stable as possible on all conventional substrates, and the acid generated therefrom on irradiation should not be corrosive.

It was further an object of the present invention to provide a recording material which is suitable for the production of photoresists, electronic components, and printed plates, and to provide a process for producing such recording materials.

It was further an object to provide a method of preparing an image pattern by use of the recording material.

In accomplishing the foregoing objectives, there has been provided, in accordance with one aspect of the present invention, a negative-working radiation-sensitive mixture comprising: a) a 2,4,6-tris-(2-hydroxyethoxy)-[1,3,5]triazine which is fully or partially esterified with two or three acids selected from arylsulfonic acids, heteroarylsulfonic acids and mixtures thereof, which generates a strong acid under the action of actinic radiation, b) at least one compound having at least two groups crosslinkable by means of said strong acid, and c) at least one polymeric binder which is insoluble in water and soluble or at least swellable in an aqueous alkaline solution.

There has further been provided a negative-working radiation-sensitive recording material comprising a support and a radiation-sensitive layer, wherein the layer comprises a radiation-curable mixture as described above.

There has also been provided a method of producing such a recording material which comprises dissolving the radiation-sensitive mixture in a solvent, and applying the resultant solution to the support and removing the solvent.

There has also been provided a method of preparing an image pattern which comprises irradiating the radiation-sensitive layer imagewise, optionally heating the irradiating layer, treating the layer with a developer which removes the irradiated areas of the layer, and optionally post-hardening the developed layer structures.

Further objects, features, and advantages of the present invention will become apparent from the detailed description of preferred embodiments that follows.

DETAILED DESCRIPTION OF THE PREFERRED EMBODIMENTS

Any known arylsulfonic acid can be used as the compound to be esterified. Preferably the arylsulfonic acids have 6 to 10 aromatic carbon atoms. Examples of these are the benzenesulfonic acids and the naphthalenesulfonic acids.

Any known heteroarylsulfonic acids can be used. Preferably, the heteroarylsulfonic acids have, in addition to 4 to 9 carbon atoms, also an aromatic oxygen atom or sulfur atom or 1 or 2 aromatic nitrogen atoms. Examples of these are the furansulfonic, thiophenesulfonic, pyrrolesulfonic, pyridinesulfonic, pyrimidinesulfonic and pyrazinesulfonic acids. Sulfonic acids having a binuclear heteroaryl radical are also suitable. For these, the benzofuransulfonic, isobenzofuransulfonic, benzo[b]thiophenesulfonic and indolesulfonic acids are suitable. If a nitrogen-containing heterocyclic compound is used, it must not be basic, since, otherwise, the acid generated in the photoreaction is neutralized by the heterocyclic radical and, as a consequence of this, the efficiency of the acid-catalyzed reaction would be drastically reduced. Basicity is, for example, caunterbalanced by appropriate substitutents at nitrogen atoms.

The arylsulfonic acids, and also the heterosulfonic acids, may be substituted or unsubstituted. In principle, the substituents can be any which do not undergo undesired reactions. Suitable substituents include linear and branched alkyl groups preferably having not more than 8 carbon atoms, such as methyl, ethyl, propyl, isopropyl, butyl, sec.-butyl, isobutyl and tert.-butyl. The alkyl groups can be fluorinated and preferably also perfluorinated. Of the perfluorinated alkyl radicals, trifluoromethyl and perfluorobutyl are suitable. Further suitable substituents include ($C_1$–$C_8$)alkoxy, ($C_1$–$C_8$)alkoxy($C_1$–$C_8$)alkoxy, ($C_1$–$C_8$)alkanoyl, ($C_1$–$C_8$)alkanoyloxy, ($C_1$–$C_8$)alkanoylamino, ($C_6$–$C_{10}$)aryl, ($C_6$–$C_{10}$)aryloxy, ($C_6$–$C_{10}$)aryl-($C_1$–$C_8$)alkoxy, ($C_6$–$C_{11}$)aroylamino, ($C_6$–$C_{11}$)aroylamino-($C_1$–$C_8$)alkyl, cyano and halogen. More than one of these substituents may be present. Independently thereof, different substituents can be present side by side. Preferred substituents are ($C_1$–$C_4$)alkyl, ($C_1$–$C_4$)alkoxy and halogen.

A sulfonic acid ester of 3 mol of aryl or hetero arylsulfonic acid and i mol of 2,4,6-tris-(2-hydroxyethoxy)-[1,3,5] triazine is in general preferred to a sulfonic acid ester of 2 mol of aryl or hetero arylsulfonic acid and mol of 2,4,6-tris-(2-hydroxyethoxy)-[1,3,5]triazine. That is, a completely esterified product is generally preferred. However, a less highly esterified product can show better solubility in special cases, and hence is sometimes preferred.

Particularly suitable (hetero)arylsulfonic acids are benzenesulfonic, 3-perfluorooctylbenzenesulfonic, 4-trifluoromethylbenzenesulfonic, 4-perfluorobutylbenzenesulfonic, toluene-4-sulfonic, 4-bromobenzenesulfonic, 4-cyanobenzenesulfonic, 4-tert.butylbenzenesulfonic, 2,4,5-trimethylbenzenesulfonic, 3,4-dichlorobenzenesulfonic acids, and 5-benzoylaminomethylthiophene-2-sulfonic acid.

The esters formed with the sulfonic acids are particularly suitable because they can be photolyzed with a high quantum yield, but at the same time have an adequate thermal stability. The acid generated on photolysis is strong enough to effect crosslinking of the crosslinkable components b) contained in the mixture according to the invention.

The preparation of the multifunctional sulfonic acid esters used in the mixture according to the invention is known per se. The starting materials used here are usually the corresponding sulfonic acid chlorides. Numerous examples of processes for preparing aromatic sulfonic acid esters are described, for example, by F. Muth in: Houben-Weyl-Müller, Methoden der organischen Chemie [Methods in Organic Chemistry], vol IX, page 633 (and references cited therein), Thieme-Verlag, 4th edition, Stuttgart 1955, and by S. Pawlenko, loc. cit., volume E11, page 1084, Thieme-Verlag, 1st edition, Stuttgart 1985, and in the patent literature. The corresponding sulfonic acid anhydrides are also suitable starting materials (see S. Pawlenko, loc. cit., volume E11, page 1086, Thieme-Verlag, 1st edition, Stuttgart 1985, and P. J. Stang, M. Hanack and L. R. Subramaniam, Synthesis, 1982,85). This applies in particular to the benzenesulfonic acid anhydrides substituted by perfluoroalkyl groups.

The radiation-sensitive mixture according to the invention is distinguished by a high sensitivity over a wide spectral range. It shows high thermal stability and makes it possible to reproduce extremely fine structures of an original in true detail. The acid generated on irradiation does not have a corrosive action, so that the mixture can also be used on sensitive substrate materials.

Surprisingly, the negative-working, radiation-sensitive mixtures according to the invention show not only a high thermal stability and plasma-etching resistance but also outstanding lithographic properties which permit resolution in the half-micrometer range and in some cases also in the sub-half-micrometer range. After imagewise irradiation and subsequent development, a negative image of the mask in true detail is obtained. The resist fields have steep flanks. In the unirradiated areas, the resist layer is completely detached, i.e., no remnants or residues of the layer remain on the substrate. The sulfonic acids generated in the photolysis lead to efficient crosslinking of the resist components b) and c), which permits the production of highly sensitive, negative-working mixtures.

Recording materials produced with the mixtures according to the invention show, surprisingly, an image differentiation which satisfies the most stringent requirements and, even more surprisingly, an improvement in contrast and resolving power. For example, the mixtures according to the invention allow the production of a highly sensitive negative-working photoresist for high-energy UV2 radiation, for example, 248 nm.

Since the mixture according to the invention is sensitive over a wide spectral range, any actinic radiation is generally suitable for imagewise irradiation. In this context, actinic radiation is to be understood as any radiation whose energy corresponds at least to that of short-wave visible light. In this case, UV radiation in the range from 190 to 450 nm, preferably from 200 to 400 nm, particularly preferably from 200 to 300 nm, and also electron beams or X-rays are particularly suitable.

The multifunctional sulfonic acid esters contained in the radiation-sensitive mixture according to the invention and generating an acid on irradiation can be used alone or in combination with other acid generators. Any known additional acid generators can be used. Suitable additional acid generators are especially the multifunctional sulfonic acid esters of aromatic polyhydroxy compounds described in German Patent Application P 41 12 974.1 filed concomitantly, which is hereby incorporated by reference.

Furthermore, the multifunctional sulfonic acid esters can also be combined with onium salts, halogen compounds, especially trichloromethyltriazine derivatives or trichloromethyloxadiazolederivatives, 1,2-disulfones, o-quinonediazidesulfonyl chlorides or organometal/organohalogen combinations. Mixtures with bis(sulfonyl)diazomethanes and sulfonyl-carbonyldiazomethanes are also possible. In such mixtures, however, the above-mentioned disadvantages associated with the additional acid-generator may reappear.

The content of multifunctional sulfonic acid esters in the mixture according to the invention can be varied according to the intended use of the mixture and is in general 0.5 to 25% by weight, preferably 3 to 15% by weight, relative to the total weight of the solids in the mixture.

The acid-crosslinkable compounds b) used are especially the resols disclosed in GB 2,082,339, and also aromatics substituted by alkoxymethyl or oxiranylmethyl groups (See European Patent Application No. 0,212,482) and monomeric and oligomeric melamine/formaldehyde condensates and urea/formaldehyde condensates (See European Patent Application No. 0,133,216, DE-A 3,634,671, and DE 3,711,264). Examples of the first type are especially the commercially available resol products Bakelite R 5363, Bakelite R 17620, Bakelite R 10282 and Kelrez 40-152 (Bakelite and Kelrez are registered trademarks.) However, resol derivatives are not altogether preferred, since they show relatively high absorptions in the deep UV region and thus cause an impairment of the image reproduction.

More suitable crosslinking agents are those known from EP-A 0,212,482, of the formula I

in which

A is —B— or —B—Y—B— and

B is a substituted or unsubstituted mononuclear aromatic hydrocarbon or an oxygen- or sulfur-containing heterocyclic aromatic compound, Y is a single bond, $(C_1-C_4)$alkylene or $(C_1-C_4)$alkylenedioxy, whose chains can be interrupted by oxygen atoms, —O—, —S—, —SO$_2$—, —CO—, —CO$_2$—, —O—CO$_2$—, —CONH— or —O—C$_6$H$_4$=O, R$^1$ and R$^2$ are hydrogen, (C$_1$-C$_6$)alkyl, C$_5$- or C$_6$-cycloalkyl, substituted or unsubstituted (C$_6$-C$_{12}$)aryl, C$_6$-C$_{12}$)aralkyl or acyl, R$^3$ is hydrogen, (C$_1$-C$_4$)alkyl or substituted or unsubstituted phenyl, n is an integer from 1 to 3 and m is an integer from 0 to 3, n+m being at least 2.

Typical crosslinking agents are accordingly aromatics and heterocyclic compounds which are polysubstituted by hydroxymethyl, acetoxymethyl and methoxymethyl groups.

Further preferred crosslinking agents are melamine/formaldehyde derivatives which have, for example, at least two free N-hydroxymethyl, N-alkoxymethyl or N-acyloxymethyl groups. In particular the N-alkoxymethyl derivatives are suitable for use in the radiation-sensitive mixture according to the invention.

The crosslinking agents are capable of crosslinking with the polymeric binders at elevated temperatures under the action of the photolytically generated acid. The general feature is that they can form a carbonium ion under the said conditions of temperature and acid.

The content of acid-crosslinkable material b) in the radiation-sensitive mixture according to the invention can be varied over a wide range and is expediently 1 to 50% by weight, preferably 5 to 25% by weight, each relative to the total weight of the solid constituents of the mixture.

The radiation-sensitive mixture according to the invention also contains at least one polymeric binder c) which is insoluble in water, but soluble or at least swellable in aqueous alkaline solutions. Any binder having these properties is useful. The binder is in particular distinguished by good dissolving power for the other constituents of the radiation-sensitive mixture according to the invention and especially by the lowest possible characteristic absorption, i.e., a high transparency, in the wavelength range from 190 to 300 nm.

Binders based solely on novolak condensation resins, which are generally used in combination with naphthoquinonediazides as photoactive components, do not meet this condition. Although novolak condensation resins show in the unexposed areas a decrease in the solubility in aqueous alkaline developers after imagewise exposure, their characteristic absorption in the range of the short wavelength desired for the irradiation is undesirably high.

However, novolak condensation resins can be used as a mixture with other resins of higher transparency. The mixing ratios here depend predominantly on the nature of the binder to be mixed with the novolak resin. Especially important factors are the degree of characteristic absorption of the binder in the said wavelength range, and also the miscibility with the other constituents of the radiation-sensitive mixture. In general, however, the binder of the radiation-sensitive mixture according to the invention preferably contain at most 30% by weight, especially at most 20% by weight, of a novolak condensation resin.

Suitable binders are homopolymers or copolymers of p-hydroxystyrene and alkyl derivatives thereof, for example of 3-methyl-4-hydroxystyrene, and homopolymers or copolymers of other vinylphenols, for example of 3-hydroxystyrene or esters or amides of acrylic acid with aromatics containing phenolic groups. Polymerizable compounds such as styrene, methyl (meth)acrylate or the like can be used as comonomers.

Mixtures having an increased plasma resistance are obtained when silicon-containing vinyl monomers, for example vinyltrimethylsilane, are also used for the preparation of the binders. The transparency of these binders in the region of interest is in general higher, so that improved structuring is possible.

Equally well, homopolymers or copolymers of maleimide can also be used. These binders too show a high transparency in the wavelength range described. Here again, the comonomers preferably used are styrene, substituted styrenes, vinyl ethers, vinyl esters, vinylsilyl compounds or (meth)acrylates.

Finally, copolymers of styrene can be used with comonomers which effect an increase in solubility in aqueous alkaline solutions. These include, for example, maleic anhydride and maleic acid half-esters.

The said binders can also be mixed with one another provided they do not impair the optical qualities of the radiation-sensitive mixture. However, binder mixtures are generally not preferred.

Any desired amount of binder can generally be used. The quantity of binder is in general 40 to 95% by weight, especially 50 to 90% by weight, relative to the total weight of the solid constituents of the radiation-sensitive mixture.

If appropriate, one or more of dyes, pigments, plasticizers, wetting agents, flow agents, polyglycols and cellulose ethers, for example ethylcellulose, can also be added to the radiation-sensitive mixtures according to the invention in order to meet special requirements, such as flexibility, adhesion and gloss.

The radiation-sensitive mixtures of the present invention can be used to coat any suitable substrate, in any known manner. When such a substrate is to be coated, the radiation-sensitive mixture according to the invention is expediently dissolved in a solvent or in a combination of solvents. Ethylene glycol and propylene glycol and the monoalkyl and dialkyl ethers derived from them, especially the monomethyl and dimethyl ethers and the monoethyl and diethyl ethers, esters derived from aliphatic (C$_1$-C$_6$)carboxylic acids and either (C$_1$-C$_8$)alkanols or (C$_1$-C$_8$)alkanediols or (C$_1$-C$_6$)alkoxy-(C$_1$-C$_8$)alkanols, for example ethyl acetate, hydroxyethyl acetate, alkoxyethyl acetate, n-butyl acetate, propylene glycol monoalkyl ether-acetate, especially propylene glycol methyl ether-acetate and amyl acetate, ethers such as tetrahydrofuran and dioxane, ketones such as methyl ethyl ketone, methyl isobutyl ketone, cyclopentanone and cyclohexanone, N,N-dialkylcarboxylic acid amides such as N,N-dimethylformamide and N,N-dimethylacetamide, and also hexamethylphosphotriamide, N-methyl-pyrrolidin-2-one and butyrolactone, and also any desired mixtures of these, are particularly suitable for this purpose. Amongst these, the glycol ethers, aliphatic esters and ketones are particularly preferred.

Ultimately, the choice of the solvent or solvent mixture depends on the coating process used, on the desired layer thickness and on the drying conditions. The solvents must also be chemically inert to the other layer constituents under the conditions used.

The solution prepared with the said solvents generally has a solids content from 5 to 60% by weight, preferably up to 50% by weight.

The invention also relates to a radiation-sensitive recording material which comprises a substrate and a radiation-sensitive mixture, preferably, applied thereto.

Possible substrates are all those materials of which capacitors, semiconductors, multi-layer printed circuits or integrated circuits are composed or from which these can be produced. Silicon substrates which can also be thermally oxidized and/or coated with aluminum, and also doped, merit special mention. In addition, all other substrates usual in semiconductor technology are possible, such as silicon nitride, gallium arsenide and indium phosphide. Moreover, the substrates known from liquid crystal display manufacture are possible, such as, for example, glass or indium-tin oxide, and also metal plates and foils - for example of aluminum, copper, zinc foils, bimetal and trimetal foils, and also electrically non-conductive foils on which metals have been vapor-deposited, and paper. These substrates can be thermally pretreated, superficially roughened, incipiently etched or, to improve desired properties, for example to enhance the hydrophilic character, pretreated with chemicals.

To impart better cohesion and/or better adhesion of the radiation-sensitive layer to the substrate surface, the layer can contain an adhesion promoter. In the case of silicon or silica substrates, adhesion promoters of the aminosilane type such as, for example, 3-aminopropyltriethoxysilane or hexamethyldisilazane, can be used for this purpose. Alternatively, the support may be provided with an adhesion-promoting layer before application of the radiaton-sensitive mixture.

Suitable supports for the production of photomechanical recording layers, such as printing forms for letterpress printing, planographic printing, screen printing and flexographic printing, are in particular aluminum plates, which may have been anodically oxidized, grained and/or silicated beforehand, and also zinc and steel plates which may be chromium-plated, and also plastic films and paper.

The recording material according to the invention is exposed imagewise to actinic radiation. Suitable radiation sources are especially metal halide lamps, carbon arc lamps, xenon lamps and mercury vapor lamps. Likewise, exposure can be carried out with high-energy radiation such as laser radiation, electron beams or X-rays. However, lamps which can emit light of a wavelength from 190 to 260 nm, i.e., especially xenon lamps and mercury vapor lamps, are particularly preferred. Furthermore, laser light sources can also be used, for example excimer lasers, especially KrF or ArF lasers, which emit at 248 and 193 nm respectively. The radiation sources must show adequate emission in the said wavelength ranges.

The thickness of the light-sensitive layer depends on the intended use. In general, it is between 0.1 and 100μm, preferably between 0.5 and 10μm, particularly preferably about 1.0μm.

The invention also relates to a process for producing a radiation-sensitive recording material. The radiation-sensitive mixture can be applied to the substrate in any known manner such as by spraying, flow-coating, rolling, whirler-coating and dipcoating. The solvent is then removed by evaporation, so that the radiation-sensitive layer remains on the surface of the substrate. The removal of the solvent can be promoted by heating the layer to temperatures of up to 150° C. The mixture can, however, also be first applied in the above-mentioned way to a temporary support, from which it is transferred under pressure and at an elevated temperature to the final support material. The materials used as temporary support can in principle be all those which are also suitable as support materials. Subsequently, the layer is irradiated imagewise. The layer is then treated with a developer solution which dissolves and removes the unexposed (non-irradiated) areas of the layer, so that a negative image of the original used in the imagewise irradiation remains on the substrate surface.

Any known developer can be used. Suitable developers are especially aqueous solutions which contain one or more of silicates, metasilicates, hydroxides, hydrogen phosphates, dihydrogen phosphates, carbonates hydrogen carbonates of alkali metal ions, alkaline earth metal ions and/or ammonium ions, and also ammonia and the like. Metal ion-free developers are described in US-A 4,729,941, EP-A 0,062,733, US-A 4,628,023, US-A 4,141,733, EP-A 0,097,282 and EP-A 0,023,758. The content of these substances in the developer solution is in general 0.1 to 15% by weight, preferably 0.5 to 5% by weight, relative to the weight of the developer solution. Preferably, metal ion-free developers are used. Small quantities of a wetting agent can be added to the developers, in order to facilitate the detachment of the soluble areas of the layer.

The developed layer structures can be post-hardened. This is effected in any known manner and in general by heating on a hot-plate up to a temperature below the flow temperature and subsequent exposure of the whole area to the UV light from a xenon-mercury vapor lamp (range from 200 to 250 nm). As a result of the post-hardening, the image structures are crosslinked, so that in general they have a flow resistance up to temperatures of more than 200° C. The post-hardening can also be effected without a temperature increase solely by irradiation with high-energy UV light.

The compounds according to the invention may be used in radiation-sensitive mixtures for the production of integrated circuits or of discrete electrical components by lithographic processes, since they show a high light sensitivity, especially in the case of irradiation with light of a wavelength between 190 and 300 nm. Since the mixtures bleach very well on exposure, structurings may be achieved which are clearly superior to those of the known mixtures in respect of their resolution capacity. The recording material produced from the mixture here serves as a mask for the subsequent process steps. Examples of such steps are etching of the layer support, the implantation of ions into the layer support or the precipitation of metals or other materials on the layer support.

The examples described below illustrate the invention which, however, is not intended to be restricted to them.

SYNTHESIS EXAMPLE 2,4,6-Tris-[2-toluene-4-sulfonyloxy)-ethoxy]-[1,3,5]triazine 73.8 g (380 mmol) of p-toluenesulfonic acid chloride were added in the course of 10 minutes at 0° C. to a solution of 20.0 g (76.5 mmol) of 2,4,6-tris-(2-hydroxyethoxy)-[1,3,5]triazine and 60.6 g (760 mmol) of pyridine in 400 ml of dry acetonitrile, and the mixture was stirred for 4 hours at 0° C. The ice bath was then removed, and the mixture was allowed to warm to room temperature. It was then slowly added dropwise with continuous stirring to 30 ml of ice-water and then extracted with 400 ml of dichloromethane. The organic phase was washed several times with saturated, aqueous sodium sulfate solution and dried with sodium sulfate. The solvent was then distilled off in vacuo. The residue was taken up in 500 ml of dichloromethane, washed with three times 150 ml of 3 N aqueous hydrochloric acid and with twice 150 ml of saturated, aqueous sodium sulfate solution and subsequently dried with magnesium sulfate. The solvent was again distilled off in vacuo. The last volatile constituents were removed in a high vacuum, the residue solidifying with foaming up. This gave 36.5 g (67%) of an almost colorless powder.

Recrystallization from an isopropanol/acetone solvent mixture gave a colorless powder having a melting point of 111° C.

The analysis of this compound gave the following values:

Calculated: C,49.78%; H, 4.60%; N,5.81%; S, 13.29%.

Found: C, 49.3%; H,4.4%; N, 5.6%; S, 13.4%.

The sulfonic acid esters of 2,4,6-tris-(2-hydroxyethoxy)-[1,3,5]triazine were characterized by $^1$H and $^{13}$C highfield nuclear magnetic resonance spectra, by elemental analyses and by thin-layer chromatography (to prove the absence of unconverted sulfonic acid chloride) and, if appropriate, by IR spectroscopy (to prove the absence of free hydroxy groups in the product).

Application examples to 8 demonstrate the suitability of the mixture according to the invention for recording materials in microlithography, using very diverse sources of radiation. By means of Comparison Examples 9 and 10, the superiority of the mixtures according to the invention over the state of the art is demonstrated. Examples 11 and 12 document the applicability of the mixture in printed circuits and planographic printing plates.

APPLICATION EXAMPLES

The coating solutions were filtered through filters of 0.2μm pore diameter and whirler-coated onto a wafer treated with an adhesion promoter (hexamethyldisilazane). The coater speed of rotation was here selected such that layer thicknesses of about 1.07μm were obtained after drying for 1 minute at 105° C., on the hot-plate.

Unless otherwise stated in the individual examples, the recording material was exposed imagewise to the UV radiation of a KrF excimer laser (248 nm) or xenon/mercury vapor lamp (260 nm, with interference filter) and then subjected to a post-exposure bake on a hot-plate at 110° C. for 1 minute.

Unless otherwise stated, the recording material was developed using a 0.27 N aqueous tetramethylammonium hydroxide solution.

In the examples which follow, parts by weight are abbreviated to p.b.w.

EXAMPLE 1

A light-sensitive recording material was prepared using a coating solution composed of

| | |
|---|---|
| 7.5 p.b.w. | of a homopolymer of 3-methyl-4-hydroxystyrene, having a softening range of ≧150° C. and a mean molecular weight of 25,000 [determined by gel permeation chromatography (GPC)], |
| 2.5 p.b.w. | of a cresol/formaldehyde resol (Bakelite R5363) and |
| 0.8 p.b.w. | of 2,4,6-tris-[2-(4-bromobenzene-sulfonyloxy)-ethoxy]-[1,3,5]triazine (prepared analogously to the Synthesis Example) in |
| 42 p.b.w. | of propylene glycol monomethyl ether-acetate. |
| Exposure: | 24 mJ/cm² (xenon/mercury vapor lamp) |
| Development: | 105 seconds |

EXAMPLE 2

A light-sensitive recording material was prepared using a coating solution composed of

| | |
|---|---|
| 8.0 p.b.w. | of a 3-methyl-4-hydroxystyrene/p-hydroxystyrene copolymer (75/25) having a softening range of >150° C. and a mean molecular weight of around 28,000 (GPC), |
| 2.0 p.b.w. | of hexa-N-methoxymethyl-melamine and |
| 1.0 p.b.w. | of 2,4,6-tris-[2-(toluene-4-sulfonyloxy)-ethoxy]-[1,3,5]triazine (prepared according to the Synthesis Example) in |
| 42 p.b.w. | of propylene glycol monomethyl ether-acetate. |
| Exposure: | 27 mJ/cm² (xenon/mercury vapor lamp) |
| Development: | 90 seconds |

EXAMPLE 3

A light-sensitive recording material was prepared using a coating solution composed of

| | |
|---|---|
| 7.5 p.b.w. | of a 1:1 styrene/maleimide copolymer having a softening range from 165 to 180° C., |
| 2.0 p.b.w. | of hexa-N-acetoxymethyl-melamine and |
| 0.7 p.b.w. | of 2,4,6-tris-[2-(4-trifluoromethyl-benzenesulfonyloxy)-ethoxy]-[1,3,5]triazine (prepared analogously to the Synthesis Example) in |
| 42 p.b.w. | of propylene glycol monomethyl ether-acetate. |
| Exposure: | 38 mJ/cm² (xenon/mercury vapor lamp) |
| Post-bake: | 2 minutes, 115° C., hot-plate |
| Development: | 80 seconds (0.02N aqueous tetramethylammonium hydroxide solution) |

EXAMPLE 4

A light-sensitive recording material was prepared using a coating solution composed of

| | |
|---|---|
| 7.5 p.b.w. | of a 1:1 styrene/maleimide copolymer having a softening range from 165 to 180° C., |
| 2.5 p.b.w. | of 4,4'-bis-methoxymethyldiphenyl sulfone and |
| 0.8 p.b.w. | of 2,4,6-tris-(2-benzenesulfonyloxy-ethoxy)-[1,3,5]triazine (prepared analogously to the Synthesis Example) in |
| 42 p.b.w. | of propylene glycol monomethyl ether-acetate. |
| Post-bake: | 1 minute, 100° C., hot-plate |
| Exposure: | 43 mJ/cm² (xenon/mercury vapor lamp) |
| Development: | 75 seconds (0.02N aqueous tetramethyl-ammonium hydroxide solution) |

EXAMPLE 5

A light-sensitive recording material was prepared using a coating solution composed of

| | |
|---|---|
| 7.5 p.b.w. | of a styrene/maleimide copolymer (molar ratio 50:50) having a softening range from |

| | |
|---|---|
| 2.5 p.b.w. | 165 to 180° C., of 4,4'-bis-methoxymethyl-diphenyl ether and |
| 0.9 p.b.w. | of 2,4,6-tris-[2-(4-tert.-butylbenzene-sulfonyloxy)-ethoxy]-[1,3,5]triazine (prepared analogously to the Synthesis Example) in |
| 42 p.b.w. | of propylene glycol monomethyl ether-acetate. |
| Exposure: | 44 mJ/cm$^2$ (xenon/mercury vapor lamp) |
| Post-bake: | 2 minutes, 115° C., hot-plate |
| Development: | 60 seconds (0.02N aqueous tetramethylammonium hydroxide solution) |

EXAMPLE 6

A light-sensitive recording material was prepared using a coating solution composed of

| | |
|---|---|
| 7.5 p.b.w. | of a styrene/4-hydroxystyrene copolymer (20:80) having a mean molecular weight of about 32,000 (GPC), |
| 2.5 p.b.w. | of hexa-N-butoxymethyl-melamine and |
| 0.8 p.b.w. | of 2,4,6-tris-[2-(toluene-4-sulfonyloxy)-ethoxy]-[1,3,5]triazine (prepared analogously to the Synthesis Example) in |
| 42 p.b.w. | of propylene glycol monomethyl ether-acetate. |
| Exposure: | 42 mJ/cm$^2$ (KrF-excimer laser) |
| Post-bake: | 90 seconds, 110° C., hot-plate |
| Development: | 60 seconds (0.02N aqueous tetramethylammonium hydroxide solution) |

EXAMPLE 7

A light-sensitive recording material was prepared using a coating solution according to Example 1, 2.5 p.b.w. of a cresol/formaldehyde resol (Bakelite® R5363) being replaced by 2.0 p.b.w. of hexa-N-methoxymethylmelamine.

| | |
|---|---|
| Exposure: | 20 mJ/cm$^2$ (KrF-excimer laser) |
| Development: | 90 seconds |

EXAMPLE 8

A light-sensitive recording material was prepared using a coating solution as in Example 2, but with the modifications that, in place of the 2,4,6-tris-[2-toluene-4-sulfonyloxy)-ethoxy]-[1,3,5]triazine used there, an identical quantity (0.8 p.b.w.) of 2,4,6-tris-2-[2-(3,4-dichlorobenzenesulfonyloxy)-ethoxy]-[1,3,5]trizaine was used.

| | |
|---|---|
| Exposure: | 31 mJ/cm$^2$ (KrF-excimer laser) |
| Development: | 90 seconds |

EVALUATION OF THE DEVELOPED RECORDING MATERIALS

The resist structures obtained according to Examples 1 to 8 represented a defect-free, negative image of the mask with satisfactorily steep resist flanks, structures of ≦0.50μm being reproduced in true detail.

A scanning electron-microscopic examination showed that the resist flanks were aligned perpendicular to the substrate surface.

The layer losses in the exposed resist areas were in all cases <20 nm/minute, in many cases <10 nm/minute according to measurements with a layer thickness measuring apparatus from Rudolph.

EXAMPLES 9 AND 10 (COMPARISON EXAMPLES)

The coating solution according to Example 7 was modified by replacing the acid-generating compound used therein by an identical quantity of triphenylsulfonium hexafluorophosphate (Example 9) or 2-nitrobenzyl tosylate (Example 10). After exposure to radiation of 260 nm wavelength at an energy of 55 or 115 mJ/cm$^2$ respectively, structures were obtained which did not show any image differentiation useful in practice.

When the onium salt was used (Example 9), coating residues were also observed in the unexposed areas, i.e. resist residues adhered to the substrate in the unexposed areas, whereas, when the tosyl ester was used (Example 10), undercut resist profiles were visible which were removable, even with enhanced exposure, only at the expense of the reproduction accuracy. Even when optimized bake and developing conditions were used, no results were achievable which led to acceptable structurings.

EXAMPLE 11

For producing an offset printing plate, a mechanically roughened and pretreated aluminum foil was whirler-coated with a coating solution of the following composition:

| | |
|---|---|
| 7.5 p.b.w. | of a cresol/formaldehyde novolak having a softening range from 105 to 120° C., |
| 2.5 p.b.w. | of a cresol/formaldehyde resol (Bakelite® R5363), |
| 1.0 p.b.w. | of 2,4,6-tris-[2-(4-bromobenzenesulfonyloxy)-ethoxy]-[1,3,5]triazine (prepared analogously to the Synthesis Example) and |
| 0.05 p.b.w. | of crystal violet base in |
| 90 p.b.w. | of propylene glycol monomethyl ether-acetate. |

After drying, the layer (layer weight about 2.5 g/m$^2$) was exposed for 55 seconds under a negative test original and, after storage for 10 minutes, the plate was heated for 2 minugtes in a circulating-air oven at a temperature of 140° C. Development was carried out using a developer of the following composition:

| | |
|---|---|
| 97.7 p.b.w. | of deionized water, |
| 1.0 p.b.w. | of 2-n-butoxyethanol, |
| 0.8 p.b.w. | of sodium metasilicate × 9 H$_2$O and |
| 0.5 p.b.w. | of sodium hydroxide. |

On development, a negative reproduction of the original in true detail became visible. After rinsing with water, the plate was made ready for printing by wiping with 1% phosphoric acid. 140,000 perfect prints were obtained from this printing plate.

EXAMPLE 12

The solution of a dry etch- and negative electroplating resist was prepared by preparing the following composition:

| | |
|---|---|
| 12.5 p.b.w. | of the novolak described in Example 11, |

| | |
|---|---|
| 10.0 p.b.w. | of hexa-N-methoxymethyl-melamine, |
| 1.0 p.b.w. | of 2,4,6-tris-[2-(3-perfluorooctyl-benzenesulfonyloxy)-ethoxy]-[1,3,5]triazine (prepared analogously to the Synthesis Example) and |
| 0.1 p.b.w. | of crystal violet in |
| 30 p.b.w. | of butanone. |

A 25μm thick polyethylene terephthalate film was coated with this solution to give a dry layer thickness of 18μm. The surface of the dry resist film was laminated to a further polyethylene terephthalate film. After peeling off the cover film, the dry film was laminated under pressure and heat to a brass plate. After cooling and peeling off the support film, the plate was exposed through an original, good image contrast becoming visible. The material was stored for 10 minutes and then heated for 4 minutes at 95° C. The unexposed areas were spray-developed using a developer of the composition indicated in Example 11. The sheet was then etched through to the smooth flanks, using commercially available iron(III) chloride solution. The milled products obtained can be yet further processed before they are separated.

What is claimed is:

1. A negative-working radiation-sensitive mixture comprising:
   a) a 2,4,6-tris-(2-hydroxyethoxy)-[1,3,5]triazine which is partially esterified with two acids or fully esterfied with three acids, each acid being selected from the group consisting of an arylsulfonic acid, a heteroarylsulfonic acid and a mixture thereof, which generates a strong acid under the action of actinic radiation,
   b) at least one compound having at least two groups crosslinkable by means of said strong acid, and
   c) at least one polymeric binder which is insoluble in water and soluble or at least swellable in an aqueous alkaline solution.

2. A negative-working radiation-sensitive mixture as claimed in claim 1, wherein the sulfonic acid comprises an arylsulfonic acid having 6 to 10 aromatic carbon atoms.

3. A negative-working radiation-sensitive mixture as claimed in claim 1, wherein the sulfonic acid comprises a heteroarylsulfonic acid having 4 to 9 carbon atoms and either 1 aromatic oxygen, 1 aromatic sulfur atom or 1 or 2 aromatic nitrogen atoms.

4. A negative-working radiation-sensitive mixture as claimed in claim 1, wherein the sulfonic acid is substituted by at least one substituent selected from the group consisting of ($C_1$-$C_6$)alkyl, ($C_1$-$C_6$)alkoxy, ($C_1$-$C_6$)alkanoyl, ($C_1$-$C_6$)alkanoyloxy, ($C_1$-$C_6$)alkanoylamino, ($C_6$-$C_{10}$)aroylamino, cyano, and halogen.

5. A negative-working radiation-sensitive mixture as claimed in claim 1, wherein the compound a) generates an acid under the action of radiation of wavelength 190 to 450 nm.

6. A negative-working radiation-sensitive mixture as claimed in claim 1, wherein c) comprises a polymer which contains phenolic hydroxy groups.

7. A negative-working radiation-sensitive mixture as claimed in claim 6, wherein the polymer comprises a substituted or unsubstituted poly(hydroxystyrene).

8. A negative-working radiation-sensitive mixture as claimed in claim 6, wherein c) comprises a polymer containing a (meth)acrylic acid esterified with a compound which, in addition to the hydroxy group required for ester formation, contains free, phenolic hydroxy groups.

9. A negative-working radiation-sensitive mixture as claimed in claim 1, wherein b) comprises a resol.

10. A negative-working radiation-sensitive mixture as claimed in claim 1, wherein b) comprises an aromatic compound substituted by at least one of alkoxymethyl or oxiranylmethyl groups.

11. A negative-working radiation-sensitive mixture as claimed in claim 1, wherein b) comprises a melamine-/formaldehyde or urea/formaldehyde condensate.

12. A negative-working radiation-sensitive recording material as claimed in claim 1, comprising 0.5 to 25% by weight of a), based on the total weight of the solids in the radiation-sensitive layer.

13. A negative-working radiation-sensitive material as claimed in claim 1, comprising 1 to 50% by weight of b) based on the total weight of solids in the radiation-sensitive layer.

14. A negative-working radiation-sensitive recording material as claimed in claim 1, comprising 40 to 95% by weight of c) based on the total weight of solids in the radiation-sensitive layer.

15. A negative-working radiation-sensitive recording material comprising a support and a radiation-sensitive layer, wherein the layer comprises a radiation-sensitive mixture as claimed in claim 1.

16. A negative-working radiation-sensitive recording material as claimed in claim 15, wherein the radiation-sensitive layer has an extinction of less than $0.5\mu m^{-1}$ for radiation of 248 nm wavelength.

17. A method of producing a recording material as claimed in claim 15 which comprises applying said radiation-sensitive layer to said support.

18. A method as claimed in claim 17, comprising dissolving said mixture in a solvent, and applying the resultant solution to said support, and optionally, removing said solvent.

19. A method as claimed in claim 17, which comprises first applying said radiation-sensitive layer to a temporary support, and then applying said support to said radiation-sensitive layer, and then optionally removing said temporary support.

20. A method for preparing an image pattern comprising irradiating the radiation-sensitive layer of claim 15 imagewise, optionally heating the irradiated area, treating the layer with a developer which removes the non-exposed areas of the layer, and optionally post-hardening the developed layer structures.

* * * * *